(12) United States Patent
Chandra

(10) Patent No.: US 8,407,540 B2
(45) Date of Patent: Mar. 26, 2013

(54) LOW OVERHEAD CIRCUIT AND METHOD FOR PREDICTING TIMING ERRORS

(75) Inventor: Vikas Chandra, Fremont, CA (US)

(73) Assignee: ARM Limited, Cambridge (GP)

( * ) Notice: Subject to any disclaimer, the term of this patent is extended or adjusted under 35 U.S.C. 154(b) by 324 days.

(21) Appl. No.: 12/801,577

(22) Filed: Jun. 15, 2010

(65) Prior Publication Data

US 2011/0004813 A1 Jan. 6, 2011

Related U.S. Application Data

(60) Provisional application No. 61/223,121, filed on Jul. 6, 2009.

(51) Int. Cl.
*G01R 31/28* (2006.01)
*H03K 3/289* (2006.01)
(52) U.S. Cl. .................................. 714/726; 327/202
(58) Field of Classification Search .................. 714/726, 714/775, 798; 327/202
See application file for complete search history.

(56) References Cited

U.S. PATENT DOCUMENTS

| | | | | |
|---|---|---|---|---|
| 6,065,145 A * | 5/2000 | Bencivenga | .................. | 714/724 |
| 6,148,425 A * | 11/2000 | Bhawmik et al. | ............. | 714/726 |
| 6,427,218 B2 * | 7/2002 | Takeoka | ........................ | 714/738 |
| 7,590,906 B2 * | 9/2009 | Miwa | .............................. | 714/726 |
| 7,613,972 B2 * | 11/2009 | Takeoka et al. | ................ | 714/731 |
| 7,644,328 B2 * | 1/2010 | Seh | ................................ | 714/726 |
| 7,917,319 B2 * | 3/2011 | Hafed | ............................. | 702/69 |
| 7,952,390 B2 * | 5/2011 | Takatori et al. | ................. | 326/93 |

OTHER PUBLICATIONS

Ernst et al., "Razor: A Low-Power Pipeline Based on Circuit-Level Timing Speculation", *36th International Symposium on Microarchitecture, IEEE Computer Society*, 2003, 12 pages.
Borkar, "Designing Reliable Systems from Unreliable Components: The Challenges of Transistor Variability and Degradation", *IEEE Computer Society*, 2005, pp. 10-16.
Kaczer et al, "Impact of MOSFET Gate Oxide Breakdown on Digital Circuit Operation and Reliability", *IEEE Transactions on Electron Devices*, vol. 49, No. 3, Mar. 2002, 7 pages.
Kang et al., "Estimation of NBTI Degradation Using $I_{DDQ}$ Measurement", *IEEE*, 2007, pp. 10-16.
Paul et al., "Impact of NBTI on the Temporal Performance Degradation of Digital Circuits", *IEEE Electron Device Letters*, vol. 26, No. 8. Aug. 2005, pp. 560-562.
Agarwal et al., "Circuit Failure Prediction and its Application to Transistor Aging", *IEEE Computer Society*, 2007, 8 pages.

* cited by examiner

*Primary Examiner* — James C Kerveros
(74) *Attorney, Agent, or Firm* — Nixon & Vanderhye P.C.

(57) ABSTRACT

A data processing circuitry includes a data input, a data output and a processing path arranged between the data input and the data output. The circuitry includes a plurality of retention circuits arranged in parallel with the processing path. At least one potential error detecting circuit including a potential error detecting path for transmitting the data signal pending at an input of one of a plurality of synchronization circuits to one of the retention circuits where the potential error detecting path includes delay circuitry for delaying the data. Also included is comparison circuitry for comparing a value of the data signal captured by one of the synchronization circuits with a value of the data signal captured by a corresponding one of the retention circuits. A comparison circuitry is configured to signal a potential error in response to detecting a difference in the captured data values.

20 Claims, 7 Drawing Sheets

LOW OVERHEAD CIRCUIT AND METHOD FOR PREDICTING TIMING ERRORS

This application claims priority to U.S. Provisional Application No. 61/223,121, filed Jul. 6, 2009, the entire contents of which are hereby incorporated by reference.

BACKGROUND OF THE INVENTION

1. Field of the Invention

The field of the invention relates to a circuit and method for predicting where timing errors may occur.

2. Description of the Prior Art

With the progressive scaling down of semiconductor, such as CMOS, device sizes, these devices are now nearing their physical and reliability limits. This has resulted in designs that were manufactured correctly wearing out and becoming unreliable over time due to mechanisms such as negative bias temperature instability (or NBT1) and gate oxide breakdown.

The aging effects on these devices can cause a design that functions correctly initially to develop timing errors over time.

This problem has been addressed in some designs by increasing margins in the design based on the worst degradation that it is predicted devices might suffer during the lifetime of the device. However, this approach leads to a decrease in the performance of the design and therefore is not appropriate for high performance devices.

This problem has been addressed in a Razor design described by Ernst et al. in "Razor a low-power pipeline based on circuit-level timing speculation" by sampling the data with a delayed clock and where errors are detected implementing a recovery phase to correct them. A drawback of this approach is that it only detects errors after they have taken place and it then requires a recovery phase and thus, there are significant performance overheads once an error has occurred.

A further way of addressing the problem is described in Agarwal et al. in "Circuit failure prediction and its application to transistor aging". In this technique a flip-flop design is used which can predict the timing errors before they happen. An inverted delayed clock is used to sample the data and generate an error signal if a transition is detected in a window before the transition happens. A drawback in this technique is the significant cost in area in implementing the delayed clock and stability checker.

It would be desirable to be able to detect timing errors in a system before they happen without unduly increasing the area of the design.

SUMMARY OF THE INVENTION

A first aspect of the present invention provides a data processing circuitry for processing data, said data processing circuitry comprising: a data input, a data output and at least one processing path arranged between said data input and said data output, said at least one processing path comprising: a plurality of synchronisation circuits for capturing and transmitting said data in response to a clock signal; and a plurality of combinational circuits arranged between said synchronisation circuits for processing said data; said data processing circuitry further comprising: a plurality of retention circuits for storing data in a low power mode, said plurality of retention circuits being arranged in parallel with said at least one processing path; and at least one potential error detecting circuit for determining during processing of said data if said data signal pending at an input to one of said plurality of synchronisation circuits is stable during a predetermined time prior to capture of said data and for signalling a potential error if said data input is determined to be unstable during said predetermined time, said at least one potential error detecting circuit comprising: a potential error detecting path for transmitting said data signal pending at said input of said one of said plurality of synchronisation circuits to one of said retention circuits said potential error detecting path comprising delay circuitry for delaying said data signal such that said data signal arrives at said retention circuit said predetermined time after it arrives at said synchronisation circuit; comparison circuitry for comparing a value of said data signal captured by said one of said synchronisation circuits with a value of said data signal captured by a corresponding one of said retention circuits, said comparison circuitry being configured to signal a potential error in response to detecting a difference in said captured data values.

The present invention recognises that in many low power circuits there are retention circuits arranged in various places throughout the circuit for retaining data values when the circuit switches to low power mode. This enables the circuit to be partially powered down when it is not active without losing data. It also recognises that although these retention circuits are required in low power mode, during normal operational mode they are not active. The present invention uses these available but non-active retention circuits to store a delayed version of the data signal during operational mode and then compares this delayed version of the signal with the non-delayed version of the signal to determine if the signal has transitioned during the delay time period. When this delay time period is immediately prior to capture of the data signal by a synchronisation element then the signal transitioning in this time window indicates that the circuitry is close to failing, as if it transitioned slightly later it would not be captured. If the circuitry contains devices that deteriorate with age such a transition detection might imply that the circuitry will fail soon unless some action such as increasing the operational voltage or decreasing the operational clocking frequency is implemented.

By reusing the retention circuits in this way, a potential timing error can be detected just by the addition of delay and comparison circuitry. Thus, errors can be predicted and measures taken to avoid them actually occurring without large circuit overheads.

In some embodiments, said data processing circuitry further comprises a control signal input for receiving a low power mode enable signal; said plurality of retention circuits each being configured in response to said low power enable signal being asserted to capture a data value currently captured by a corresponding one of said synchronisation circuits and to retain said data value during said low power mode.

Although the retention circuit can have a number of forms, in some embodiments they are arranged to capture a data value captured by a corresponding synchronisation circuit in response to a low power enable signal.

In some embodiments, said data processing circuitry further comprises a plurality of switching circuits arranged between said plurality of retention circuits and a corresponding plurality of synchronisation circuits, said plurality of switching circuits being responsive to said low power mode enable signal being asserted to connect said retention circuits to said corresponding synchronisation circuits and being responsive to said low power mode enable signal not being asserted to isolate said retention circuits from said corresponding synchronisation circuits.

The retention circuits may be connected to the synchronisation circuit via switching circuits that are responsive to the low power mode enable signal to either connect the retention circuit to the synchronisation circuits so that the value stored in the synchronisation circuit can be stored in the retention circuit, or to isolate them from them so that the retention circuits do not receive values from the synchronisation circuits. This arrangement means that during normal operational mode the retention circuits do not usually receive the values stored in the synchronisation circuits and thus, can be used for other purposes.

In some embodiments, said data processing circuitry further comprises a control signal input for receiving a timing error detection mode enable signal, said timing error detection mode enable signal being asserted indicating a mode of operation is to be entered in which potential timing errors are detected; switching circuitry arranged on said potential error detecting path, said switching circuitry being responsive to said timing error detection mode enable signal being asserted to connect said retention circuit to said input of said synchronisation circuit and being responsive to said timing error detection mode enable signal not being asserted to isolate said retention circuit from said input of said synchronisation circuit.

Where the retention circuits are also used for timing error detection then switching circuitry can be arranged on the potential error detecting path to connect the retention circuit to the input of the synchronisation circuit in the error detection mode and to isolate them from this path when they are not in this mode. In this way, the retention circuits can be connected to the synchronisation circuits in low power mode to store the values that they hold and be connected to their inputs in error detection mode to receive the input signal via delaying circuitry. Thus, the retention circuit can have a dual use depending on the mode of operation of the processing circuitry and the area efficiency of the design is increased.

In some embodiments said plurality of synchronisation circuits comprise latches responsive to one phase of said clock cycle to receive and transmit input data and to an opposite phase of said clock cycle to capture said input data and output said captured data, neighbouring latches being responsive to opposite clock phases to receive and transmit said data.

Although the synchronisation circuits can have a number of forms, in some embodiments they comprise latches. Embodiments of the present invention are appropriate to latch based designs and can be used to detect timing errors using the retention circuitry that is present for the low power mode of operation.

In some embodiments, said plurality of synchronisation circuits comprise latches arranged as master slave flip flops, such that received data is output in response to one of said edges of said clock signal, said retention circuit being configured to receive data captured by said slave latch in response to said low power mode enable signal being asserted, and being configured to capture a data signal at an input to said master latch delayed by said delay circuitry in response to said low power enable signal not being asserted.

Alternatively, the synchronisation circuits might be in the form of master slave flip flops.

In other embodiments, at least some of said plurality of synchronisation circuits comprise retention flip flops, said retention flip flops each comprising one of said plurality of retention circuits.

Master slave flip flops may have the form of retention flip flops wherein there is a retention latch within the flip flop that is configured to retain the value stored in the flip flop in response to a low power mode enable signal. If this is the form of the synchronisation circuits then in embodiments of the present invention the retention latches within the flip flop may be used to retain the delayed signal during operational mode, in order to detect potential timing errors. It may be that not all of the master slave flip flops have this capability as it may be known that potential timing errors are only likely to occur at particular points on critical paths in the circuit. Thus, it may be that only some of the flip flops have the additional delaying and comparing circuitry added to them to detect potential errors.

It should be noted that in some designs all the synchronisation circuits within the circuitry are retention flip flops as it may be simpler to design a system using the same kind of synchronisation circuits throughout. In such a case, in some embodiments all of them may be used to detect potential timing errors while in others only some of them may be so designed.

In other embodiments some of the synchronisation circuits are retention flip flops while others are not. Some designs might recognise that in low power mode only some of the values stored in the synchronisation circuits need to be retained and thus, only these synchronisation circuits are implemented as retention flip flops. Retention flip flops have a larger area than master slave flip flops without the retention latch, thus reducing their number saves on area. Once again only some of these retention flip flops may be used to detect potential timing errors.

In some embodiments, said comparison circuitry is gated by said error detection mode enable signal and said clock, such that in response to at least one of said error detection mode enable signal not being asserted and said clock not having a value that triggers capture of said data no potential error signal is output.

In order to control output of the predicted error signal, the comparison circuitry may be gated by the error detection mode enable signal so that a predicted error signal is only output during potential error detection mode, and by the clock. Values stored in a synchronisation circuit and the retention circuit change at different times as one of them is the delayed value. The important thing is that the value is the same at the point in the clock cycle that the synchronisation element captures the data value. Thus, the output of the comparison circuitry can also be gated by this clock signal so that only when it has the value that triggers capture of the data in the synchronisation circuit is a signal output from the potential error detection circuit. This inhibits any glitches in the signal generating a false error signal.

In some embodiments, said data processing circuitry further comprises control circuitry responsive to at least one of said potential error detecting circuits signalling a potential error to raise an operating voltage of at least a portion of said data processing circuitry.

When a potential error has been detected this signals that the processing circuitry is operating close to a failure limit and if the devices are deteriorating with time then it may soon fail. Thus, in some embodiments the data processing circuitry has control circuitry that is responsive to this signal to raise an operating voltage of the data processing circuitry and thereby, increase the performance of the circuitry and help to prevent an error. In many embodiments the voltage of the whole data processing circuitry is increased in response to a detected potential error. In other embodiments it may be only the portion of the data processing circuitry where the potential error is detected that has its voltage level increased. Although, in the latter case the power consumption of the circuitry is improved, it may be that providing different voltage levels in this way is overly complicated and the power savings do not merit the increase in complexity of the circuit.

In some embodiments, said control circuitry comprises circuitry for combining an output from a plurality of said potential error detecting circuits and is configured to generate a global error signal in response to any of said plurality of potential error detecting circuits detecting an error, said control circuitry being responsive to said global error signal to raise said operating voltage.

There may be many potential error detecting circuits arranged throughout the data processing circuitry all generating particular output signals. It may therefore be convenient to combine at least some of them to generate a global error signal that is used as in input to the control circuitry.

In other embodiments, said data processing circuitry further comprises control circuitry responsive to at least one of said potential error detecting circuitry signalling a potential error to lower a clocking frequency of at least a portion of said data processing circuitry.

In some embodiments, the control circuitry may lower the clocking frequency of the data processing circuitry rather than increasing the operating voltage. It should be noted that raising the operational voltage will increase the performance of the devices and therefore make devices operate faster and within the desired clocking limits. Alternatively, if it is not desirable to increase the operating voltage, the clocking frequency can be decreased so that devices that were only just operating within the set limits can now operate more easily within them.

In some embodiments, said data processing circuitry comprises a plurality of potential error detecting circuits, said plurality of potential error detecting circuits being configured to detect a stability of said data signal at an input to a plurality of synchronisation circuits arranged on critical timing paths within said data processing circuitry.

A plurality of potential error detecting circuits may be arranged to detect the stability of the data signal at an input to synchronisation circuits arranged on critical timing paths within the data processing circuitry. Timing errors will generally happen on the critical timing paths and thus, if the critical timing paths are known, it is advantageous to provide potential error detecting circuits at these places as it is here that the processing circuitry will fail first.

In some embodiments, each of said plurality of potential error detecting circuits comprise delay circuitry configured to delay said data signal by a predetermined time, said predetermined time being selected for each of said plurality of potential error detecting circuits in dependence upon robustness and performance criteria and upon how close said critical timing path being monitored by said potential error detecting circuit is to a set-up time.

The delay circuitry provides the predetermined time by which the data signal is delayed, and thus, determines how close to the system failing errors are detected at. Thus, if a large time window is used then instabilities occurring at quite some time from the capture point are detected and if the parameters of the system are adjusted to take any instabilities out of these timing windows then the system will be very robust to any errors occurring. If however the time window is smaller then the performance of the system will be increased as the clock will not be slowed or the voltage raised until the system is nearer to failing, and thus, the system will have a better performance.

Another point that can determine the desired delay of the delay circuitry is the critical path that is being detected. If the critical path is one where the timing along it is close to the design set-up time then the error window should be larger than for critical paths that are not close to the design set-up time. This is because the critical paths close to the design set-up time are those where failure will probably occur first and thus, it is very important to detect any late transitions occurring on these paths.

A second aspect of the present invention provides a synchronisation circuit comprising a data input, a data output and at least one latch located on a processing path between said data input and said data output for capturing a data value input at said data input prior to output at said data output, said synchronisation circuit further comprising: a retention latch arranged in parallel with said processing path and coupled to said at least one latch for storing a data value captured by said at least one latch in a low power mode; and at least one potential error detecting circuit for determining during processing of said data if said data signal pending at an input to said at least one latch is stable during a predetermined time prior to capture of said data and for signalling a potential error if said data input is determined to be unstable during said predetermined time, said at least one potential error detecting circuit comprising: a potential error detecting path for transmitting said data signal pending at said input of said at least one latch to said retention latch said potential error detecting path comprising delay circuitry for delaying said data signal such that said data signal arrives at said retention latch said predetermined time after it arrives at said at least one latch; comparison circuitry for comparing a value of said data signal captured by said at least one latch with a value of said data signal captured by said retention latch, said comparison circuitry being configured to signal a potential error in response to detecting a difference in said captured data values.

Where a synchronisation circuit also has a retention function such that it has at least one latch on a processing path and a retention latch arranged to store a data value during a low power mode, it has been recognised that this circuit could be amended to perform error prediction using the retention latch for this purpose. The retention latch is used in low power mode to retain the current data value and as is not generally used in operational mode. Thus, by simply adding delay and comparison circuitry a synchronisation circuit that can be used to both transmit and retain data in processing mode and predict potential timing errors and can be used in low power mode to retain data is produced.

A third aspect of the present invention provides a method of detecting potential timing errors within data processing circuitry, said method comprising: receiving a data signal at an input and transmitting said data signal via at least one processing path to an output, said at least one processing path comprising a plurality of synchronisation circuits for capturing and transmitting said data in response to a clock signal and a plurality of combinational circuits arranged between said synchronisation circuits for processing said data, at least some of said synchronisation circuits having a retention circuit arranged in parallel for storing data in a low power mode; transmitting said data signal pending at an input of one of said synchronisation circuit to a retention circuit via delay circuitry for delaying said data signal such that said data signal arrives at said retention circuit said predetermined time after it arrives at said one of said synchronisation circuits; comparing a value of said data signal captured by said synchronisation circuit with a value of said data signal captured by said retention circuit; signalling a potential error in response to detecting a difference in said captured data values.

A fourth aspect of the present invention provides data processing means for processing data, said data processing means comprising: a data input means for receiving input data, a data output means for outputting data and at least one processing path arranged between said data input means and said data output means, said at least one processing path comprising: a plurality of synchronisation means for capturing and transmitting said data in response to a clock signal; and a plurality of combinational means arranged between said synchronisation means for processing said data; said data processing means further comprising: a plurality of retention means for storing data in a low power mode, said plurality of retention means being arranged in parallel with said at least one processing path; and at least one potential error detecting means for determining during processing of said data if said data signal pending at an input to one of said plurality of synchronisation means is stable during a predetermined time prior to capture of said data and for signalling a potential error if said data input is determined to be unstable during said predetermined time, said at least one potential error detecting means comprising: a potential error detecting path for transmitting said data signal pending at said input of said one of said plurality of synchronisation means to one of said retention means said potential error detecting path comprising delay means for delaying said data signal such that said data signal arrives at said retention means said predetermined time after it arrives at said synchronisation means; comparison means for comparing a value of said data signal captured by said one of said synchronisation means with a value of said data signal captured by a corresponding one of said retention means, said comparison means being configured to signal a potential error in response to detecting a difference in said captured data values.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
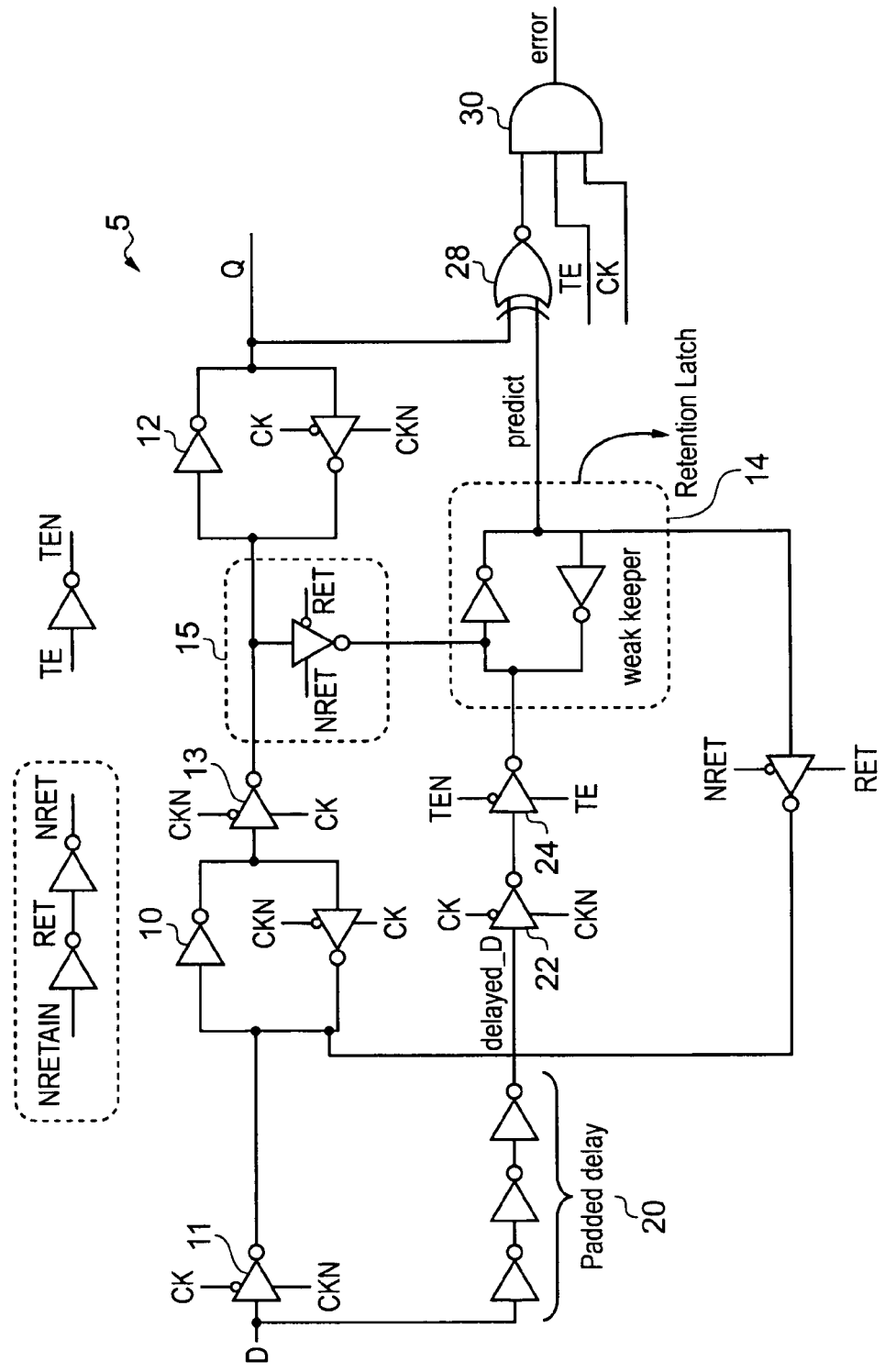
FIG. 1 shows a retention flip flop with error prediction capability according to an embodiment of the present invention.

FIG. 1 shows a retention flip flop according to an embodiment of the present invention that is based on a traditional single control balloon register with additional circuitry to provide an error prediction capability. Thus, flip flop 5 comprises a master latch 10, a slave latch 12 and a retention latch 14. The retention latch 14 is responsive to a retention control signal RET to capture the data currently stored in the slave latch and to retain this data while components on the processing path running from data in D to data out Q are powered down. Thus, the switching device which in this embodiment is a tristate inverter 15 and the retention latch 14 are permanently powered even in low power mode. The components in FIG. 1 that are permanently powered are shown with a dotted line around them.

When the retention control signal RET is not asserted then the flip flop operates in operational mode and data received at the input D is clocked into master latch 10 and then through to slave latch 12 and is output at output Q.

This flip flop differs from conventional retention flip flops by the addition of an error prediction capability. This involves the additional components 20, 22, 24, 28 and 30. Components 20, 22 and 24 provide a path for data input to the flip flop to pass through to the retention latch 14. This path has a delay element 20 for generating a predetermined delay and two tristate inverters 22, 24 which act as switching devices to isolate the retention latch from the data input or to connect it to it. Tristate inverter 22, is controlled by the clock signal which acts to control the timing of the device in a similar way to the tristate inverters 11 and 13 on the processing path, while tristate inverter 24 is controlled by an error prediction enable signal TE. Tristate inverter 24 acts to isolate the retention latch 14 from the processing path D to Q when error prediction capability is not required. Similarly in low power mode these elements are powered down and thus, in this mode too the retention latch is isolated from the processing path.

The delay element 20 is selected so that the delay to the input signal is the required length. The required delay length depends on the robustness and performance criteria of the circuit and also on the location of the flip flop element within the circuit. If it is on a critical timing path that is close to the set-up time of the circuit then any transition that is close to the clocking edge needs to be detected as an error may well occur with time when ageing of the components will reduce their performance further. Thus, in such a case the delay circuitry should provide a reasonably sized delay, such that any transitions that are within this time period before the clocking edge can be detected and action taken to prevent them becoming errors.

If the elements are on a less critical path then the delay circuitry can be designed to generate a smaller delay as it is only transitions that are very close to the edge that need to be detected. Alternatively, if it is very important that the design is robust then these delay elements should also generate a longer delay, while if performance is more important than robustness they should be smaller. In general a longer delay element will detect more transitions that are further from the point of capture and thus, will generate predicted error signals earlier and will reduce performance earlier but will generate a more robust circuit.

A predicted error is generated if the data retained in the retention latch 14 is different to the data retained in the master latch 10. This occurs if there is a transition in the data within the predetermined time dictated by the size of the delay element. This potential error is detected by using exclusive NOR gate 28 that signals a potential error when the value stored in the slave latch 12 and that stored in the retention latch are different. This signal is output via AND gate 30. AND gate 30 is there to gate the error signal so that it is only output in error prediction mode, that is when the error prediction mode enable signal TE is asserted and also it is clocked at the output to ensure that glitches in the error signal that may arise if there are differences in the values stored in latches 12 and 14 before the clocking signal transitions are prevented from being output. This will be discussed later with reference to the timing diagrams of FIGS. 6 and 7.

Figure 2:
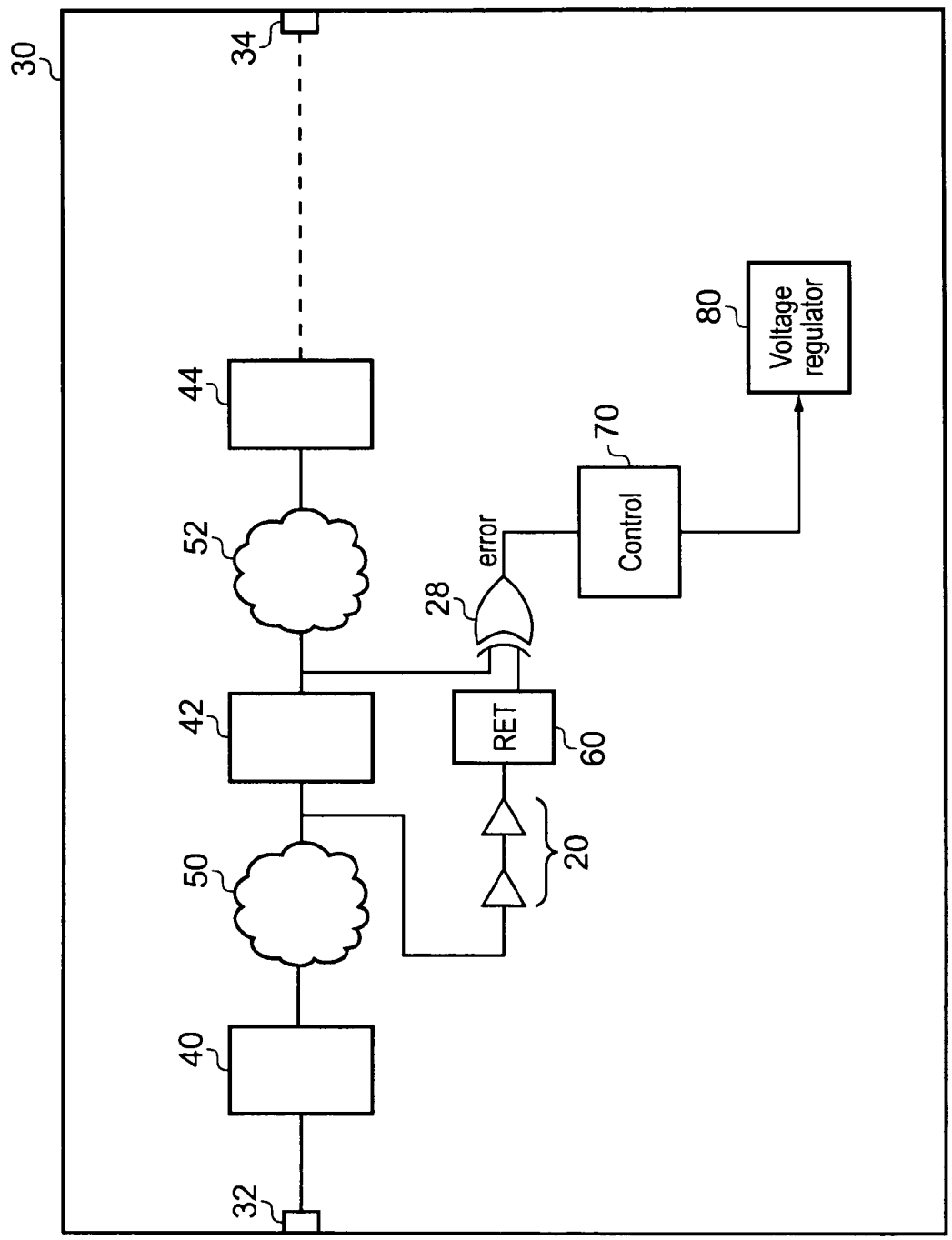
FIG. 2 schematically shows a data processing apparatus comprising synchronisation circuits with error prediction capability and voltage control according to an embodiment of the present invention.

FIG. 2 shows a data processing apparatus 30 having a data input 32 and a data output 34. It comprises a plurality of synchronisation circuits 40, 42 and 44 which in this embodiment are latches and combinational circuitry 50 and 52 between them for processing the data. One of the latches 42 has a retention capability with a retention latch 60 arranged in parallel with it. This retention latch 60 is configured to receive the value stored in latch 42 in response to a low power mode enable signal and to retain this value during the low power mode. It is also configured to receive the input to latch 42 via delay circuitry 20 in operational mode. Comparison circuitry 28 then compares the value stored in retention latch 60 with that stored in latch 42 and generates an error signal if there is a difference. This error signal is received by control circuitry 70 which controls voltage regulator 80 to adjust the voltage powering the processing circuitry in response to a predicted error. In this way, any transition close to the timing point where data is captured by latch 42 will be detected and will result in the voltage regulator increasing the voltage to the processing circuitry so that the transition occurs earlier and any further degradation of the circuitry will not generate an error.

Figure 3:
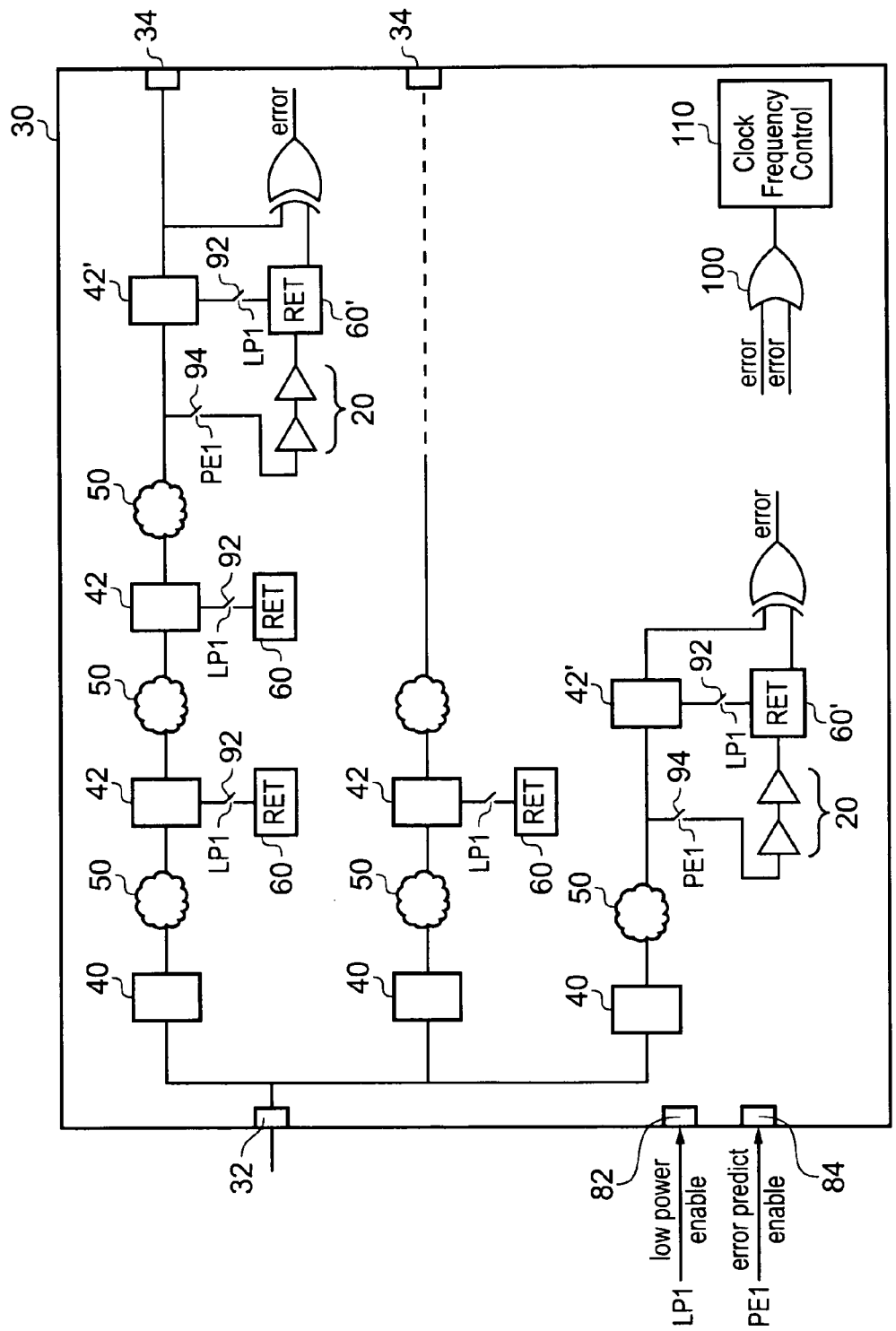
FIG. 3 shows data processing circuitry comprising error prediction circuitry and control circuitry for controlling a clocking frequency in response to the error prediction.

FIG. 3 shows processing circuitry 30 according to another embodiment of the present invention. As in FIG. 2 the circuitry comprises a data input 32 and in this case a plurality of data outputs 34. In this embodiment, there are a plurality of latches 40 which do not have retention capabilities and a plurality of latches 42 that do. A subset of these retention latches 42' have been designed to provide error prediction capabilities and are latches according to an embodiment of the present invention. The latches 42' that have this error predicting capability are latches on a critical timing path of the processing circuitry where it is important to discover any transitions that are occurring late in the clocking cycle. Critical timing points might be where combinational circuitry 50 takes longer to perform its processing operations than other combinational circuitry.

In this embodiment, there are two control inputs 82 and 84 that are configured to receive the low power mode enable LP1 signal and the error predict enable signal PE1 respectively. These signals are used to control the switches that connect the retention circuit 60 to the synchronisation circuits 42. Thus, in response to the low power enable signal LP1 being asserted switch 92 is closed and the data stored in latch 42 is transferred to retention latch 62. In response to the low power enable signal LP1 not being asserted, switch 92 is opened and the retention latch 60 is isolated from the latch 42.

In response to error predict enable signal PE1 being asserted then switch 94 is closed and the signal input to latch 42' passes through delay elements 20 and is captured by retention latch 60'. The value captured by retention latch 60' is then compared with the value captured by latch 42' and if there is a difference, an error signal is output.

In this embodiment, the error signals that are output are combined using OR gate 100 and are input to clock frequency control circuitry 110 which controls the clocking frequency of the processing circuitry 30. Thus, if it is detected that there is a transition towards the end of the clock cycle in any one of the latches 42' then clock frequency control circuitry 110 slows down the clocking frequency of processing circuitry 30 thereby providing a safety margin so that the transition does not occur after the end of the capture cycle for the latch. Thus, if the circuitry slows down due to aging effects it will still be within the required limits and no errors will be generated.

Figure 4:
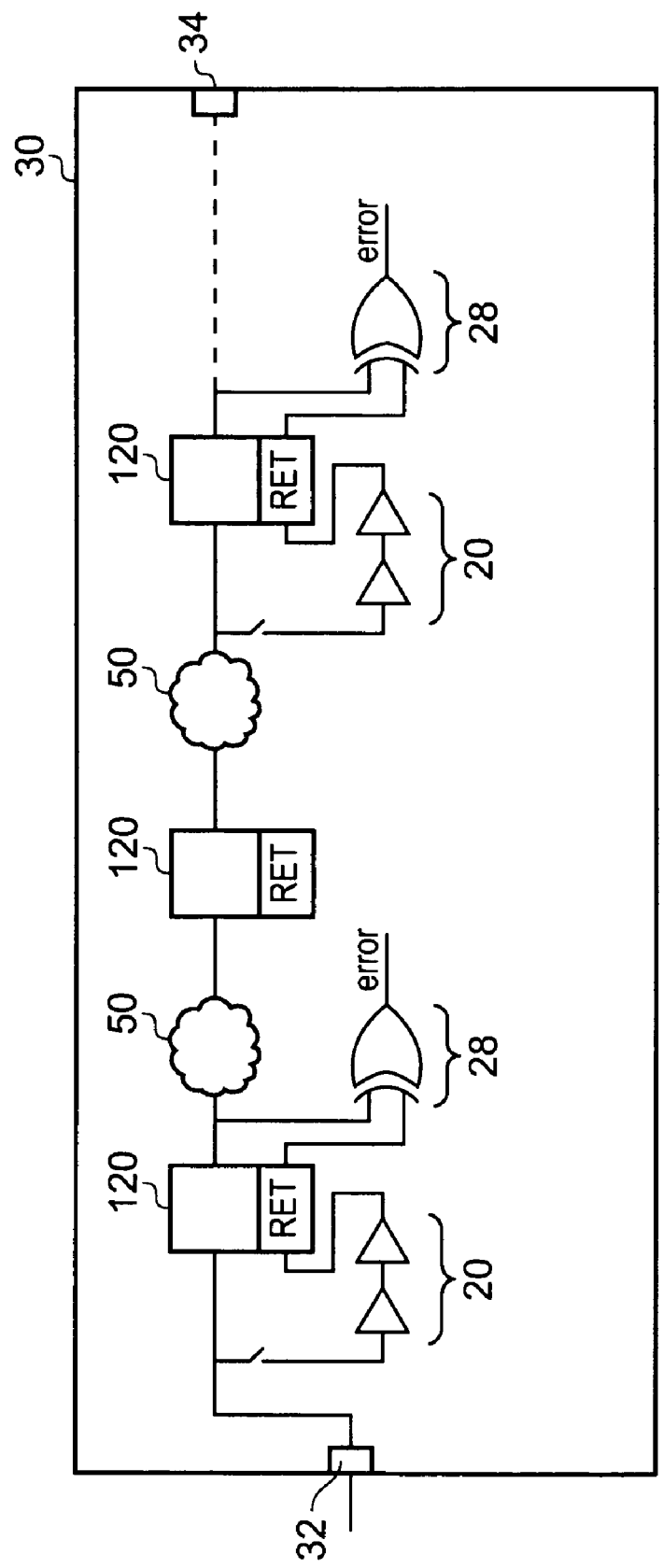
FIG. 4 schematically shows data processing circuitry wherein the synchronisation circuits are retention flip flops, some of the retention flip flops having error prediction capability.

FIG. 4 shows an alternative embodiment of a data processing apparatus 30 according to an embodiment of the present invention. In this embodiment, the synchronisation circuits are all retention flip flops. These are larger than flip flops that do not have retention capabilities but do enable the apparatus to retain data in a low power mode. Furthermore, although it may not be required for each synchronisation circuit to retain its data in low power mode, it is often more practical to design a circuit with the same type of components rather than designing a circuit with different sorts of synchronisation elements. Thus, in this embodiment there are a plurality of retention flip flops 120 with combinational circuitry 50 between them. Some of the retention flip flops have been provided with error predicting capabilities and thus, have delay elements 20 and comparing means 28 added to them. Thus, in error prediction mode the input signal to the flip flop 120 is input to the storage latch on the processing path and also via delay circuitry to the retention latch that lies parallel to the processing path. Comparing circuitry 28 compares the values stored in each latch and if they are different then the input data signal has transitioned during the delay period prior to the clock transition that triggers data capture and a predicted error signal is generated to indicate this late transition.

Figure 5:
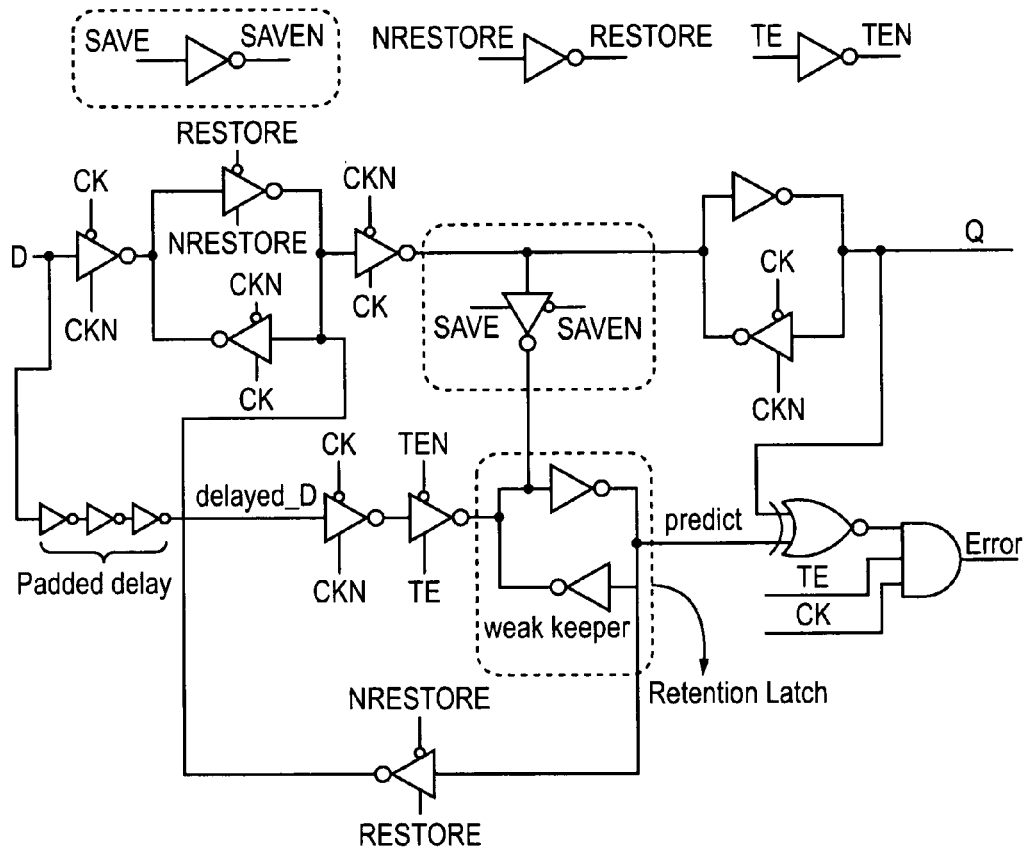
FIG. 5 shows an alternative embodiment of a retention flip flop having error detection capability.

FIG. 5 shows an alternative flip flop to that shown in FIG. 1. This is based on the dual control balloon register of the prior art. In this embodiment there are two signals SAVE and NRESTORE to save and restore the state respectively. As in FIG. 1 the devices inside the dotted box are connected to the always on supply. The implementation is a variant of the implementation shown in FIG. 1 but the mode of operation is identical.

Figure 6:
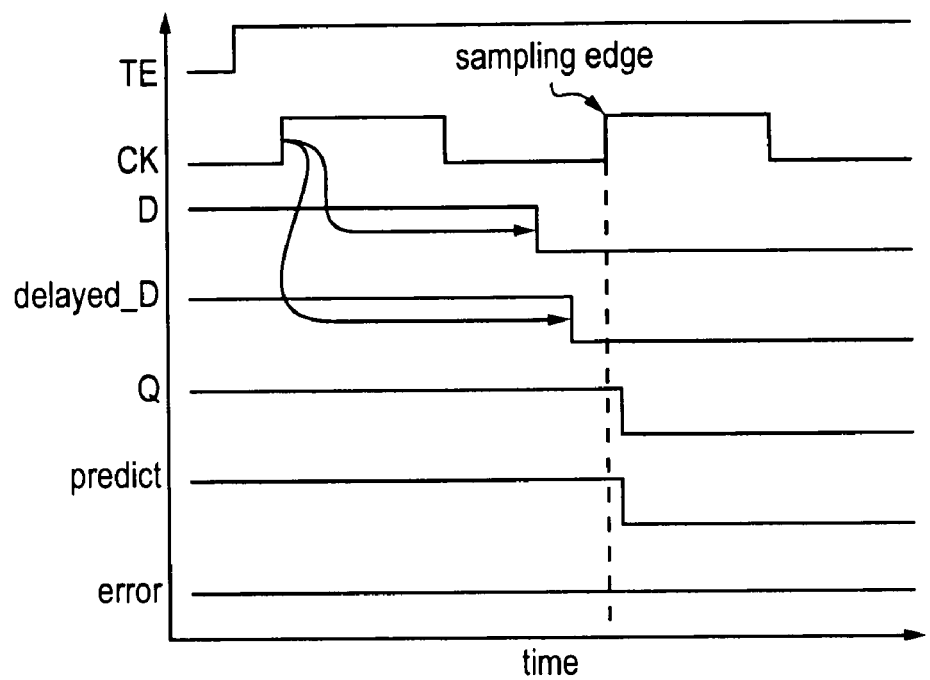
FIG. 6 shows a timing diagram illustrating the timing of transitions of the flip flop of FIG. 1 where there are no late transitions.

FIG. 6 shows a timing diagram of the flip flop of FIG. 1 where the transition occurs outside of the delay period and thus, no error is predicted. In this case, the data attains its value before the clock transition and the delay data delayed_D also attains this value before the clock transition. Thus, in this case both nodes Q which is the output of the flip flop on the processing path and Predict which is the output of the retention flop have the same value at the sampling edge of the clock. Thus, no error is predicted. The error signal is gated by AND gate 30 with the TE signal and the CK signal. This ensures that no output is given when not in error prediction mode and also that the error is sampled when the clock transitions to its sampling edge such that any differences in the delayed_D and D that occur before this do not generate an error signal.

Figure 7:
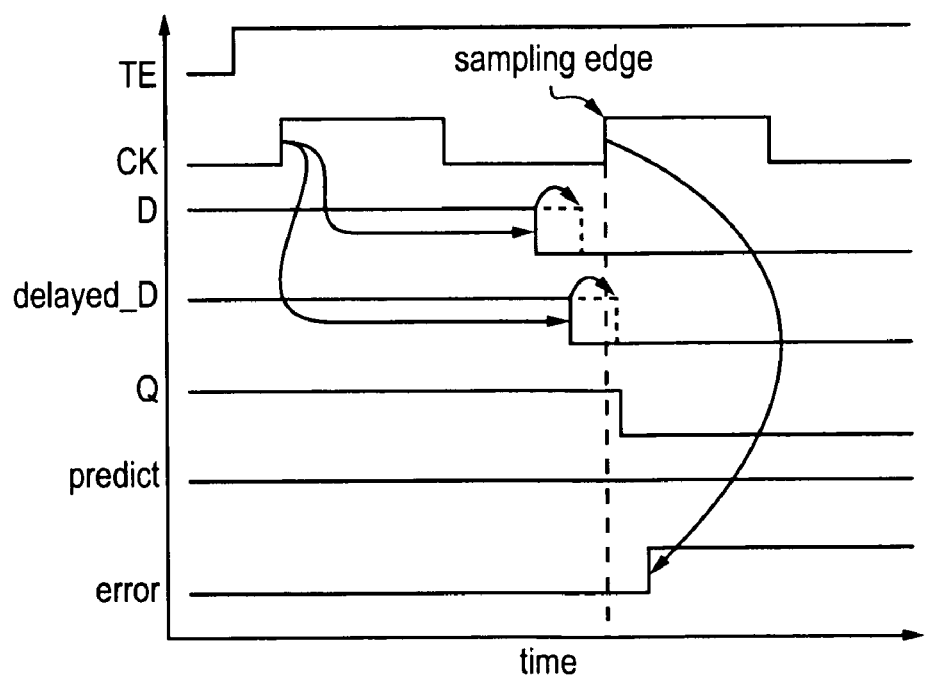
FIG. 7 shows a timing diagram of FIG. 1 where there is a late transition that generates a potential error prediction.

FIG. 7 shows a timing diagram of the circuit of FIG. 1 when a data signal attains its value late within the predetermined period determined by delay circuitry 20 and therefore, an error is predicted. In this case the data D transitions late but still early enough to meet the set up constraints of the circuit. However, the delayed data delayed_D violates the set-up constraints and transitions after the clock edge. This indicates that if the circuit continues to degrade, then data D itself may soon also transition late enough to violate the set-up constraints. The shift in the transition of D and delayed_D due to degradation of the components between the timing diagram of FIG. 6 and that of FIG. 7 is shown by the dotted lines in FIG. 7. Thus, these dotted lines show how the circuitry has aged compared to the circuitry sampled in FIG. 6 and how these data transitions have therefore occurred later. Thus, in this case the node Q transitions in time for the new value to be captured by the latch but the delayed data does not and thus, the old value is captured so that the predict node holds this old value and hence gate 28 will assert an error signal 1 and when the clock goes high the error from gate 28 will appear on the error signal output.

Figure 8:
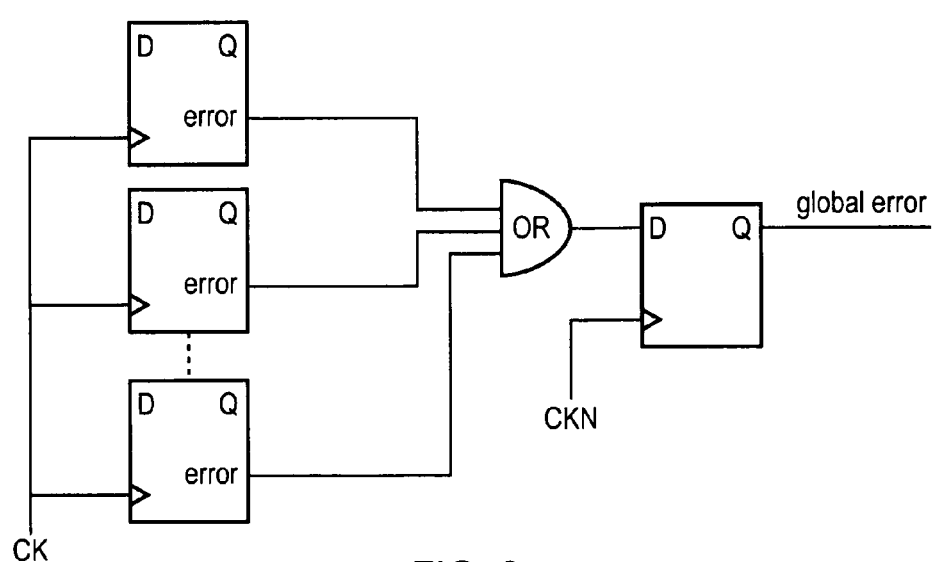
FIG. 8 shows a circuit for combining the predicted errors to generate a global error that can be used to control the operational parameters of the dating processing circuitry.

FIG. 8 shows an apparatus for system level handling of aging errors wherein the error signals generated by the different error prediction circuits are combined using an OR gate to generate a global error which is then used by control circuitry to control the parameters of the processing circuitry. Thus, a detected potential error from any one of the detection circuits will be sufficient to generate a global error that is used to trigger a change in the operating parameters of the processing circuitry. These changes might include raising the operational voltage level or decreasing the clocking frequency.

Figure 9:
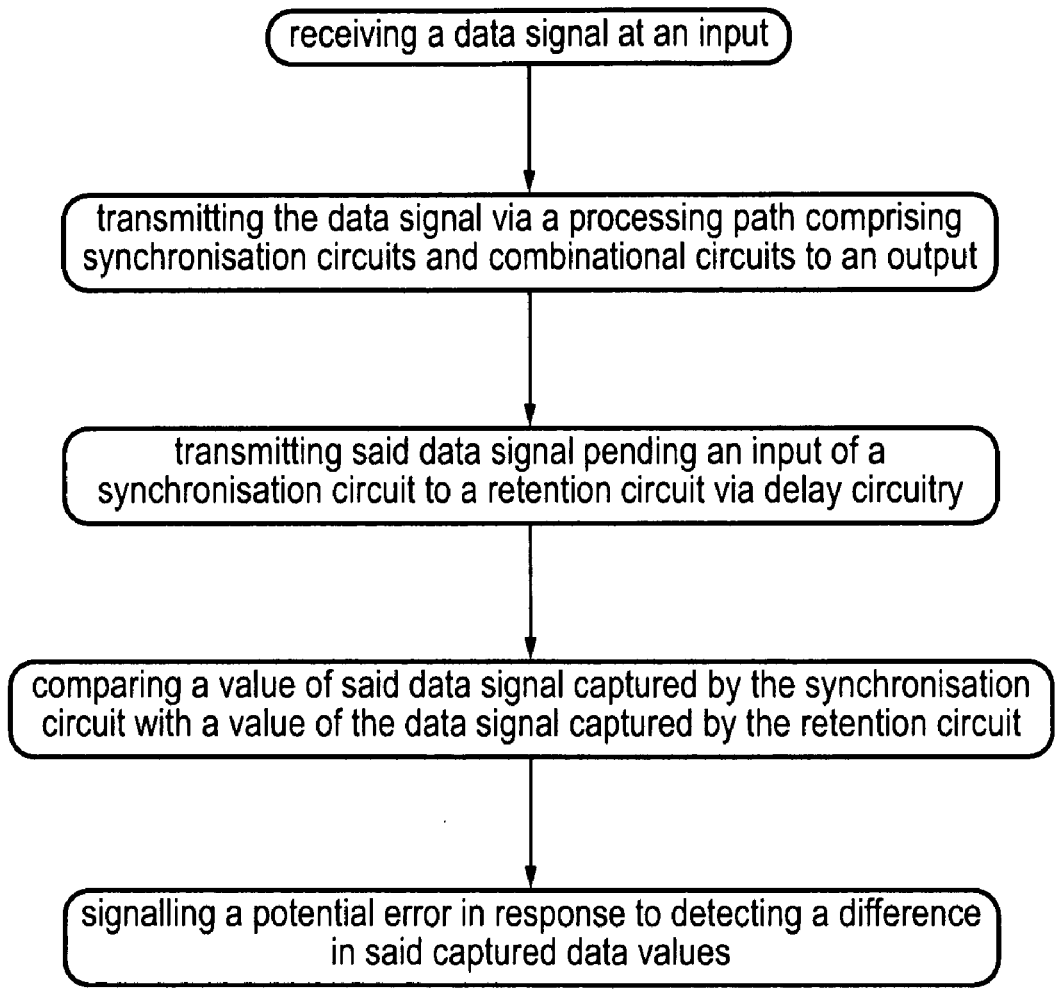
FIG. 9 shows a flow diagram illustrating a method according to an embodiment of the present invention.

FIG. 9 shows a flow diagram illustrating a method of predicting timing errors in processing circuitry according to an embodiment of the present invention. In this method a data signal is received at an input and this data signal is transmitted via a processing path which comprises synchronisation circuits and combinational circuits to an output. The processing circuitry also comprises retention circuits for retaining data values during a low power mode.

The method includes the step of transmitting a data signal pending at an input of a synchronisation circuit to a retention circuit via delay circuitry. The value of the data signal captured by the synchronisation circuit is then compared with a value of the data signal captured by the retention circuit. A potential error is signalled in response to detecting a difference in these captured values. This error signal indicates that the data signal has transitioned late in the clock cycle and thus if no steps are taken an error may occur later if the devices of the circuit degrade.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

I claim:

1. Data processing circuitry for processing data, said data processing circuitry comprising:
    a data input, a data output and at least one processing path arranged between said data input and said data output, said at least one processing path comprising:
        a plurality of synchronisation circuits for capturing and transmitting said data in response to a clock signal; and
        a plurality of combinational circuits arranged between said synchronisation circuits for processing said data;
    a plurality of retention circuits for storing data in a low power mode, said plurality of retention circuits being arranged in parallel with said at least one processing path; and
    at least one potential error detecting circuit for detecting potential errors by determining during processing of said data if said data signal pending at an input to one of said plurality of synchronisation circuits is stable during a predetermined time prior to capture of said data and for signalling a potential error if said data input is determined to be unstable during said predetermined time, said at least one potential error detecting circuit comprising:
        a potential error detecting path for transmitting said data signal pending at said input of said one of said plurality of synchronisation circuits to one of said retention circuits said potential error detecting path comprising delay circuitry for delaying said data signal such that said data signal arrives at said retention circuit said predetermined time after it arrives at said synchronisation circuit;
        comparison circuitry for comparing a value of said data signal captured by said one of said synchronisation circuits with a value of said data signal captured by a corresponding one of said retention circuits, said comparison circuitry being configured to signal a potential error in response to detecting a difference in said captured data values; and
    a control signal input for receiving a low power mode enable signal, each of said plurality of retention circuits configured, in response to said low power enable signal being asserted, to capture a data value currently captured by a corresponding one of said synchronisation circuits and to retain said data value during said low power mode, wherein during said low power mode said corresponding ones of said synchronisation circuits are powered down.

2. Data processing circuitry according to claim 1, said data processing circuitry further comprising:
    a plurality of switching circuits arranged between said plurality of retention circuits and a corresponding plurality of synchronisation circuits, said plurality of switching circuits being responsive to said low power mode enable signal being asserted to connect said retention circuits to said corresponding synchronisation circuits and being responsive to said low power mode enable signal not being asserted to isolate said retention circuits from said corresponding synchronisation circuits.

3. Data processing circuitry according to claim 1, wherein said plurality of synchronisation circuits comprise latches arranged as master slave flip flops, such that received data is output in response to one of said edges of said clock signal, said retention circuit being configured to receive data captured by said slave latch in response to said low power mode enable signal being asserted, and being configured to capture a data signal at an input to said master latch delayed by said delay circuitry in response to said low power enable signal not being asserted.

4. Data processing circuitry according to claim 1, wherein at least some of said plurality of synchronisation circuits comprise retention flip flops, said retention flip flops each comprising one of said plurality of retention circuits.

5. Data processing circuitry according to claim 1, said data processing circuitry further comprising:
    a control signal input for receiving a timing error detection mode enable signal, said timing error detection mode enable signal being asserted indicating a mode of operation is to be entered in which potential timing errors are detected;
    switching circuitry arranged on said potential error detecting path, said switching circuitry being responsive to said timing error detection mode enable signal being asserted to connect said retention circuit to said input of said synchronisation circuit and being responsive to said timing error detection mode enable signal not being asserted to isolate said retention circuit from said input of said synchronisation circuit.

6. Data processing circuitry according to claim 5, wherein said comparison circuitry is gated by said error detection mode enable signal and said clock, such that in response to at least one of said error detection mode enable signal not being asserted and said clock not having a value that triggers capture of said data no error signal is output.

7. Data processing circuitry according to claim 1, wherein said plurality of synchronisation circuits comprise latches responsive to one phase of said clock cycle to receive and transmit a data input and to an opposite phase of said clock cycle to capture said input data and output said captured data, neighbouring latches being responsive to opposite clock phases to receive and transmit said data.

8. Data processing circuitry according to claim 1, said data processing circuitry further comprising control circuitry responsive to at least one of said potential error detecting circuits signalling a potential error to raise an operating voltage of at least a portion of said data processing circuitry.

9. Data processing circuitry according to claim 8, said control circuitry comprising circuitry for combining respective outputs from a plurality of said potential error detecting circuits and configured to generate a global error signal in response to any of said plurality of potential error detecting circuits detecting an error, said control circuitry being responsive to said global error signal to raise said operating voltage.

10. Data processing circuitry according to claim 1, said data processing circuitry further comprising control circuitry responsive to at least one of said potential error detecting circuitry signalling a potential error to lower a clocking frequency of at least a portion of said data processing circuitry.

11. Data processing circuitry according to claim 10, said control circuitry comprising circuitry for combining an output from a plurality of said potential error detecting circuits and being configured to generate a global error signal in response to any of said plurality of potential error detecting circuits detecting an error, said control circuitry being responsive to said global error signal to lower said clocking frequency.

12. Data processing circuitry according to claim 11, wherein each of said plurality of potential error detecting circuits comprise delay circuitry configured to delay said data signal by a predetermined time, said predetermined time being selected for each of said plurality of potential error detecting circuits in dependence upon robustness and performance criteria and upon how close said critical timing path being monitored by said potential error detecting circuit is to a set-up time.

13. Data processing circuitry according to claim 1, said data processing circuitry comprising a plurality of potential error detecting circuits, said plurality of potential error detecting circuits being configured to detect a stability of said data signal at an input to a plurality of synchronisation circuits arranged on critical timing paths within said data processing circuitry.

14. A synchronisation circuit comprising a data input, a data output and at least one latch located on a processing path between said data input and said data output for capturing a data value input at said data input prior to output at said data output, said synchronisation circuit further comprising:
a retention circuit arranged in parallel with said processing path and coupled to said at least one latch for storing a data value captured by said at least one latch in a low power mode;
at least one potential error detecting circuit for detecting potential errors by determining during processing of said data if said data signal pending at an input to said at least one latch is stable during a predetermined time prior to capture of said data and for signalling a potential error if said data input is determined to be unstable during said predetermined time, said at least one potential error detecting circuit comprising:
a potential error detecting path for transmitting said data signal pending at said input of said at least one latch to said retention latch said potential error detecting path comprising delay circuitry for delaying said data signal such that said data signal arrives at said retention latch said predetermined time after it arrives at said at least one latch;
comparison circuitry for comparing a value of said data signal captured by said at least one latch with a value of said data signal captured by said retention latch, said comparison circuitry being configured to signal a potential error in response to detecting a difference in said captured data values; and
a control signal input for receiving a low power mode enable signal, wherein said retention circuit is configured, in response to said low power enable signal being asserted, to capture a data value currently captured by said at least one latch and to retain said data value during said low power mode, wherein during said low power mode said at least one latch is powered down.

15. A method of detecting potential timing errors within data processing circuitry, said method comprising:
receiving a data signal at an input and transmitting said data signal via at least one processing path to an output, said at least one processing path comprising a plurality of synchronisation circuits for capturing and transmitting said data in response to a clock signal and a plurality of combinational circuits arranged between said synchronisation circuits for processing said data, at least some of said synchronisation circuits having a retention circuit arranged in parallel for storing data in a low power mode;
transmitting said data signal pending at an input of one of said synchronisation circuit to a retention circuit via delay circuitry for delaying said data signal such that said data signal arrives at said retention circuit said predetermined time after it arrives at said one of said synchronisation circuits;
comparing a value of said data signal captured by said synchronisation circuit with a value of said data signal captured by said retention circuit;
signalling a potential error in response to detecting a difference in said captured data values;
receiving a low power mode enable signal;
capturing and retaining, in response to said low power enable signal being asserted, data values currently captured by said synchronisation circuits; and
powering down said corresponding ones of said synchronisation circuits.

16. A method according to claim 15, comprising a first step of receiving a timing error detection mode enable signal, and, in response to said timing error detection mode enable signal being asserted, connecting said retention circuit to said input of said synchronisation circuit and, in response to said timing error detection mode enable signal not being asserted, isolating said retention circuit from said input of said synchronisation circuit.

17. A method according to claim 15, comprising a further step of in response to the signalling of a potential error raising an operating voltage of at least a portion of said data processing circuitry.

18. A method according to claim 15, comprising a further step of in response to the signalling of a potential error reducing a clocking frequency of at least a portion of said data processing circuitry.

19. A method according to claim 15, comprising transmitting said data signal pending at an input of a plurality of said synchronisation circuit to a corresponding plurality of said retention circuits via a plurality of delay circuitry for delaying said data signal such that said data signal arrives at said corresponding retention circuits said predetermined time after it arrives at said plurality of said synchronisation circuits;
   comparing a value of said data signal captured by each of said synchronisation circuits with a value of said data signal captured by said corresponding retention circuit;
   signalling a potential error in response to detecting a difference in any one of said captured data values.

20. Data processing means for processing data, said data processing means comprising:
   a data input means for receiving input data, a data output means for outputting data and at least one processing path arranged between said data input means and said data output means, said at least one processing path comprising:
      a plurality of synchronisation means for capturing and transmitting said data in response to a clock signal; and
      a plurality of combinational means arranged between said synchronisation means for processing said data;
   a plurality of retention means for storing data in a low power mode, said plurality of retention means being arranged in parallel with said at least one processing path; and
   at least one potential error detecting means for detecting potential errors by determining during processing of said data if said data signal pending at an input to one of said plurality of synchronisation means is stable during a predetermined time prior to capture of said data and for signalling a potential error if said data input is determined to be unstable during said predetermined time, said at least one potential error detecting means comprising:
      a potential error detecting path for transmitting said data signal pending at said input of said one of said plurality of synchronisation means to one of said retention means said potential error detecting path comprising delay means for delaying said data signal such that said data signal arrives at said retention means said predetermined time after it arrives at said synchronisation means;
      comparison means for comparing a value of said data signal captured by said one of said synchronisation means with a value of said data signal captured by a corresponding one of said retention means, said comparison means being configured to signal a potential error in response to detecting a difference in said captured data values; and
   a control signal input means for receiving a low power mode enable signal, each of said plurality of retention means configured, in response to said low power enable signal being asserted, to capture and retain a data value currently captured by a corresponding one of said synchronisation means during said low power mode, wherein corresponding ones of said synchronisation circuits are powered down.

* * * * *